US007885069B2

(12) United States Patent
Fredericksen et al.

(10) Patent No.: US 7,885,069 B2
(45) Date of Patent: Feb. 8, 2011

(54) IMPLEMENTING ADAPTABLE THREE PHASE MODULAR LINE FILTERING

(75) Inventors: Ross T. Fredericksen, Mantorville, MN (US); Edward C. Gillard, Mantorville, MN (US); Don A. Gilliland, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 61 days.

(21) Appl. No.: 12/478,175

(22) Filed: Jun. 4, 2009

(65) Prior Publication Data

US 2010/0311275 A1 Dec. 9, 2010

(51) Int. Cl.
*H05K 7/20* (2006.01)

(52) U.S. Cl. ........................................ 361/695; 363/44

(58) Field of Classification Search ................. 361/818, 361/695, 717; 363/40–44
See application file for complete search history.

(56) References Cited

U.S. PATENT DOCUMENTS 6,301,130 B1 * 10/2001 Aiello et al. .................. 363/37
2003/0162442 A1 * 8/2003 Panella ........................ 439/608
2009/0161335 A1 * 6/2009 Li et al. ...................... 361/818

* cited by examiner

*Primary Examiner*—Phuong K Dinh
(74) *Attorney, Agent, or Firm*—Joan Pennington

(57) ABSTRACT

A modular line filter connector is provided for implementing adaptable three-phase power filtering. A plurality of selected modular components defines the modular line filter connector. The modular line filter connector includes a pair of outer cylinders providing power filtering connections including, for example, line-to-line connections, line-to-common connections, common-to-protective earth connections, and line-to-protective earth connections. The selected modular components are mounted between the pair of outer cylinders and disposed along the length of the modular line filter connector. Different modular components are selected to adapt the modular line filter connector for different filtering applications.

20 Claims, 11 Drawing Sheets

100

IMPLEMENTING ADAPTABLE THREE PHASE MODULAR LINE FILTERING

FIELD OF THE INVENTION

The present invention relates generally to the data processing field, and more particularly, relates to a modular line filter connector for implementing adaptable three-phase power filtering.

DESCRIPTION OF THE RELATED ART

A switching power supply produces noise that is fed back to the power cord into the mains building power system. This connection provides the power necessary to run an associated system. The noise cannot exceed a legal level as defined by the country regulations that outline the EMC requirements for that country as well as any worldwide requirements that are in place.

A problem typical with many existing systems is that the systems are space constrained and may not have the room in the power area to provide the full filtering that may be needed.

Short development cycles can be adversely affected by providing an available component that needs to be verified at final system test. Fully populated systems usually exhibit increased noise due to the increased current or increased content in the system enclosure.

A need exists for an effective mechanism for implementing adaptable three-phase power filtering.

SUMMARY OF THE INVENTION

A principal aspect of the present invention is to provide a modular line filter connector for implementing adaptable three-phase power filtering. Other important aspects of the present invention are to provide such modular line filter connector for implementing adaptable three-phase power filtering substantially without negative effect and that overcome many of the disadvantages of prior art arrangements.

In brief, a modular line filter connector is provided for implementing adaptable three-phase power filtering. A plurality of selected modular components defines the modular line filter connector. The modular components are selected to adapt the modular line filter connector for different filtering applications. A pair of outer cylinders provides power-filtering connections for the modular line filter connector. The power filtering connections are provided with each selected modular component. The selected modular components are mounted spaced apart along a length of the modular line filter connector.

In accordance with features of the invention, the modular line filter connector is an integral power connector to a three-phase power system.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
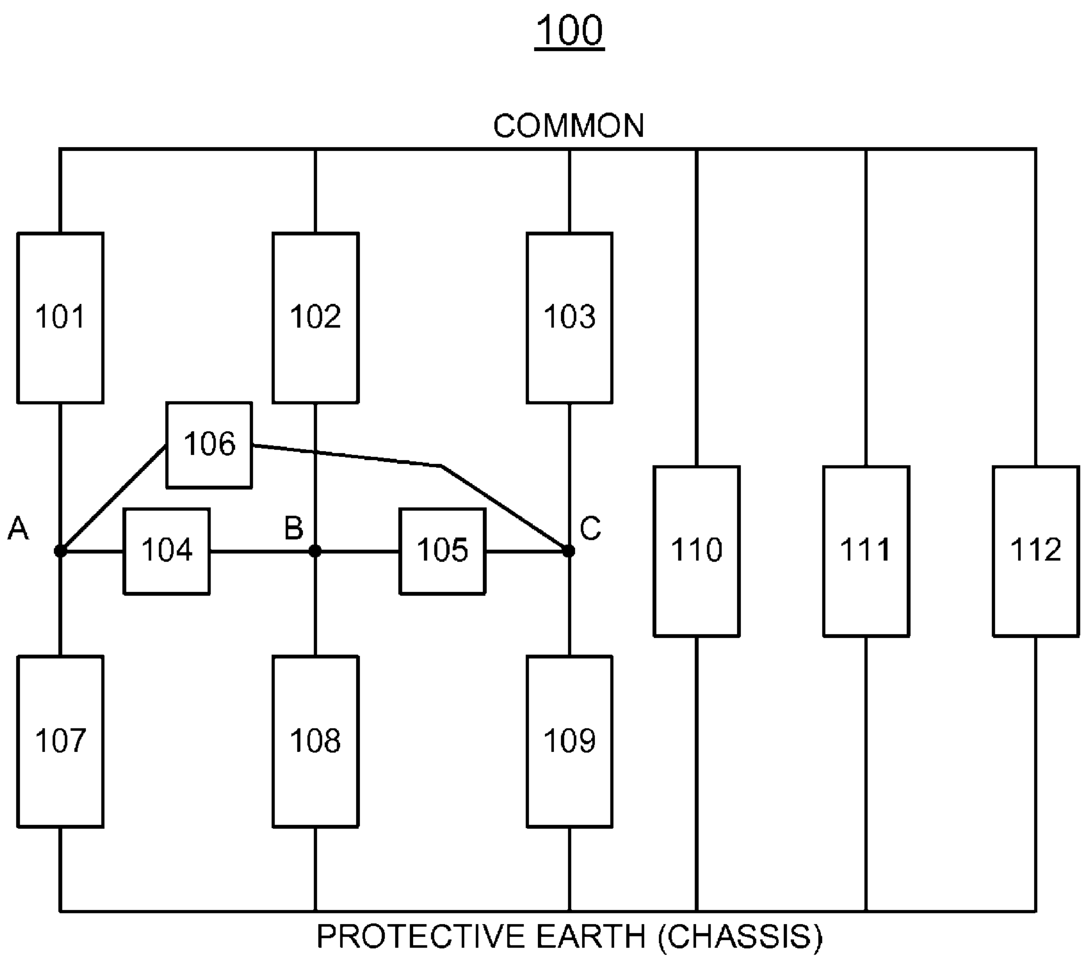
FIG. 1 is a schematic diagram representation illustrating a modular line filter connector for implementing adaptable three-phase power filtering in accordance with the preferred embodiment.

In accordance with features of the invention, a modular line filter connector is provided for implementing adaptable three-phase power filtering. A plurality of selected modular components defines the modular line filter connector. The modular line filter connector advantageously is easily adaptable for various filtering applications by using different selected modular components.

Having reference now to the drawings, in FIGS. 1-10, there is shown an example modular line filter connector for implementing adaptable three-phase power filtering generally designated by the reference character 100 in accordance with the preferred embodiment. Modular line filter connector 100 is formed integral with or residing within a power connector.

Modular line filter connector 100 implements an adaptable filtering arrangement for the three-phase filter. Each switching supply can exhibit a different type of problem for the filter, namely, common mode vs. differential mode or a combination. Modular line filter connector 100 includes different modular components that are selected to adapt the modular line filter connector for different filtering applications.

For the adaptable modular line filter connector 100, a plurality of modular components 101, 102, through 112, are provided to form needed impedances within the connector. As shown in FIG. 1, component connections are provided for each power line phase, Phase A, Phase B, and Phase C, including Line to Line (or neutral if single phase), Line to Common, Common to Shield or Protective earth, and Line to Protective earth.

It should be understood that various other arrangements are possible to implement the filtering circuit of the modular line filter connector 100.

Figure 2:
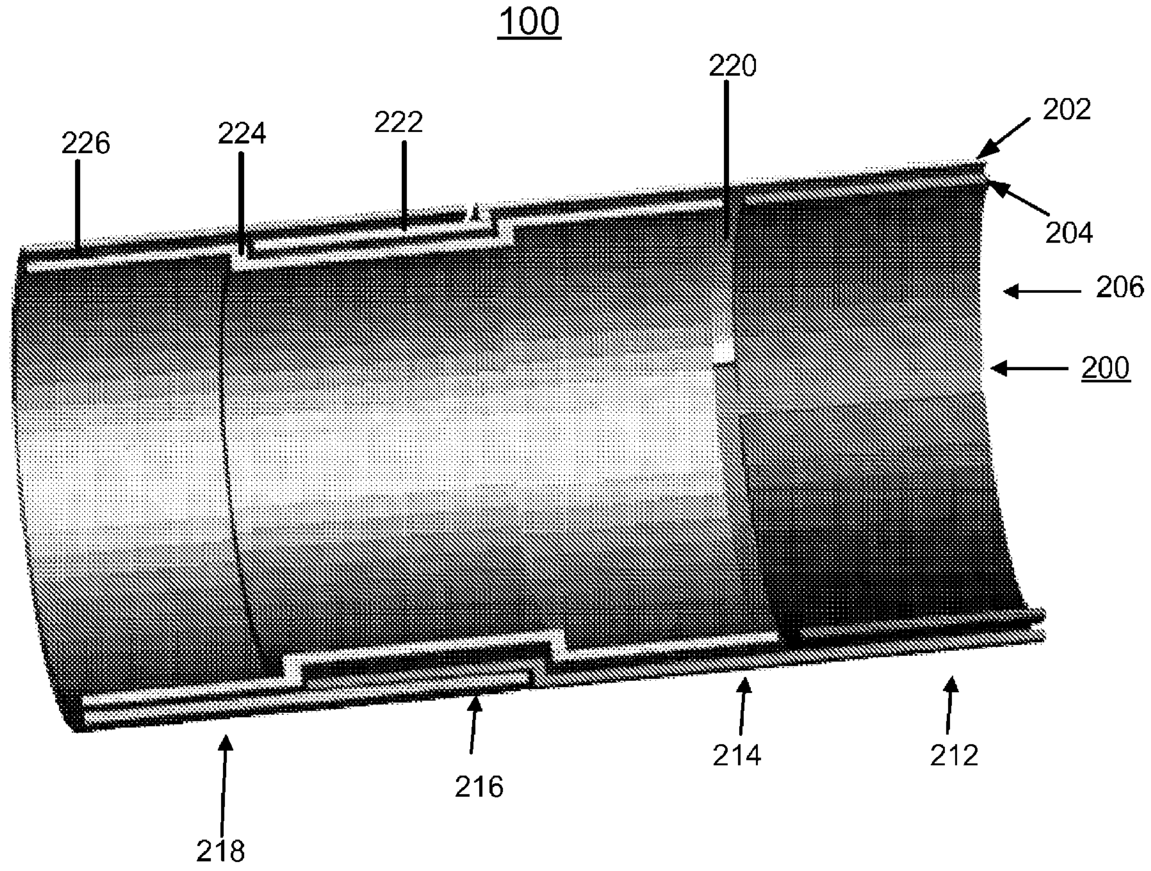
FIG. 2 is a fragmentary cutaway perspective view illustrating an example cylindrical connection arrangement including a pair of outer cylinders of the modular line filter connector of FIG. 1 in accordance with the preferred embodiment.

FIG. 2 is a fragmentary cutaway perspective view illustrating an example cylindrical connection arrangement 200 including a pair of outer cylinders generally designated by the reference characters 202, 204 of the modular line filter connector 100 of FIG. 1 in accordance with the preferred embodiment.

Cylindrical connection arrangement 200 allows selected modules to be mounted between portions of the outer two cylinders 202, 204 along the length of the adaptable modular line filter connector 100. For 3-phases including Phase A, Phase .B, and Phase C, then 4 connections per phase are needed to provide a total of 12 connections, as illustrated in FIG. 1. A group, for example, generally designated by 206 for each phase, or three connection groups for 3-phases are spaced 120 degrees apart, with 4 locations spaced apart along the length of the connector 100, such as generally indicated by 212, 214, 216, 218. Then, for example, a line-to-line connection is indicated at 220, a line to common connection is indicated at 222, a protective earth to phase connection is indicated at 224, and a protective earth to common connection is indicated at 226.

Figure 3:
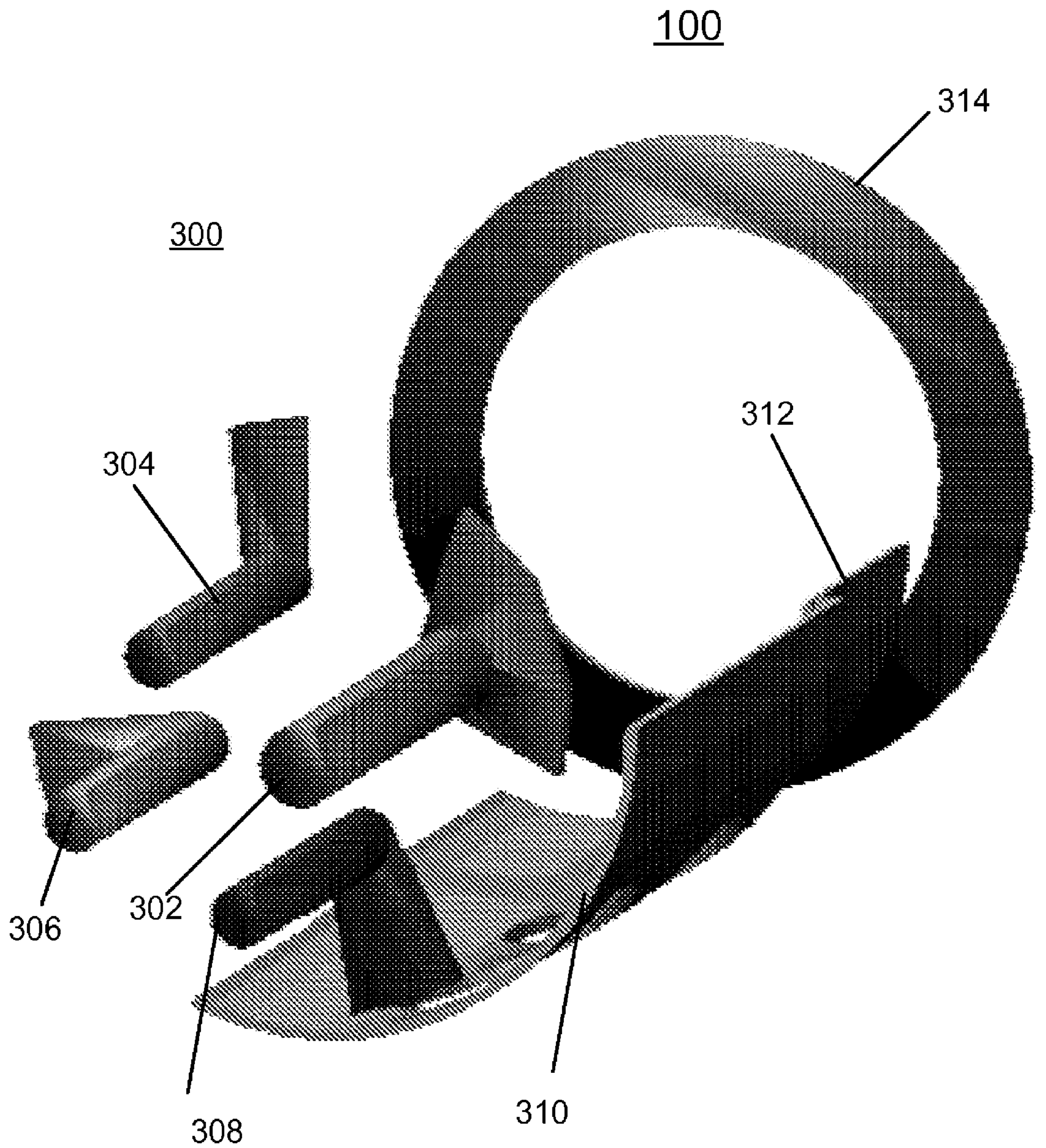
FIGS. 3 and 4 are respective exploded perspective views illustrating interior details of the modular line filter connector of FIG. 1 in accordance with the preferred embodiment.
Figure 4:
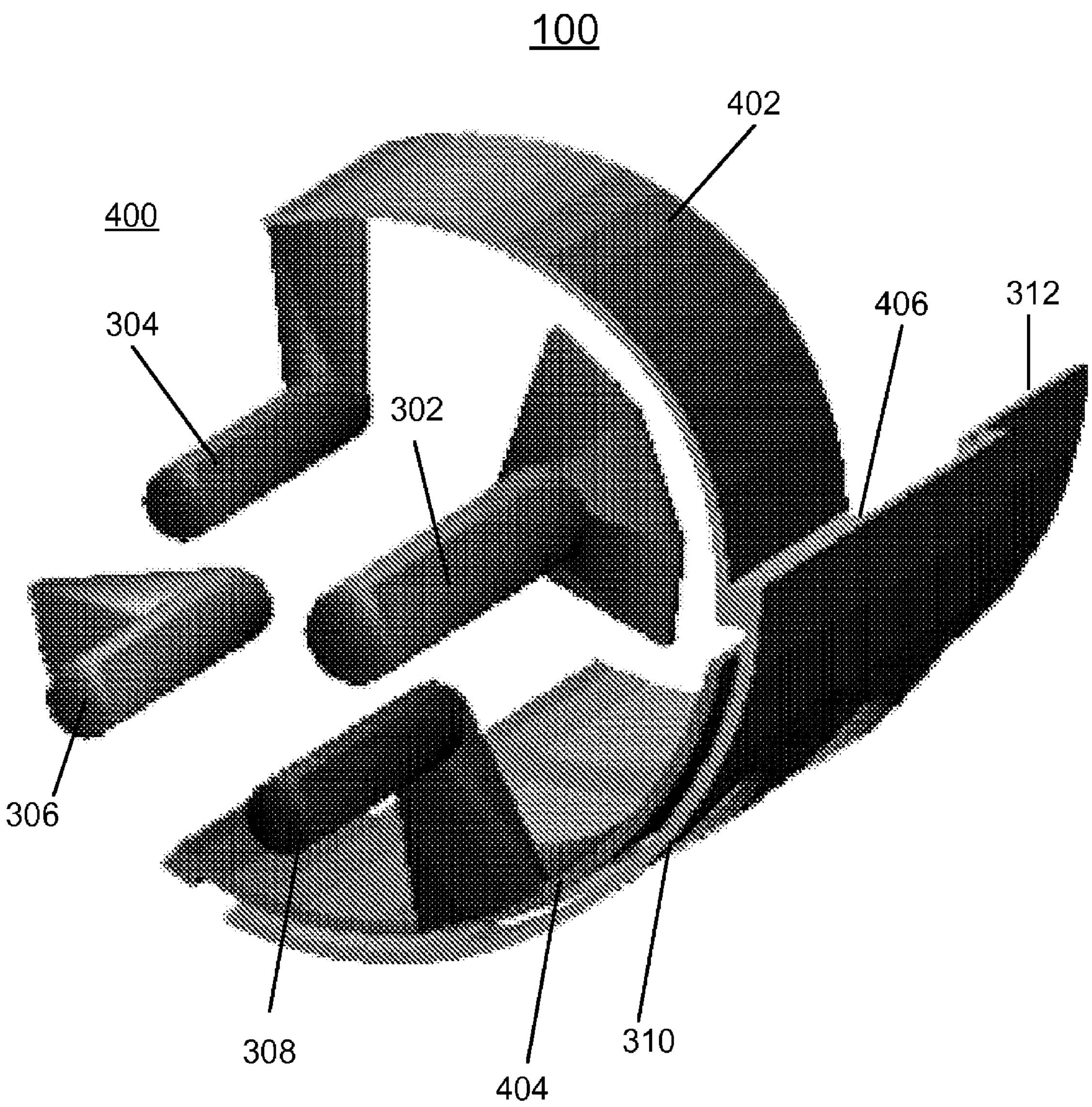

FIGS. 3 and 4 are respective exploded perspective views generally designated by the reference characters 300, 400 illustrating example interior details of the modular line filter connector 100 in accordance with the preferred embodiment.

FIG. 3 illustrates a plurality of power filtering connection components 302, 304, 306, 308 included in the interior assembly 300. The power filtering connection components 302, 304, 306, 308 include a respective outwardly extending prong member providing integral power connector connections to a power system. For example, component 304 represents a Phase A power filtering connection component. Component 306 represents a Phase B power filtering connection component. Component 308 represents a Phase C power filtering connection component. Component 302 represents a Ground power filtering connection component. The power filtering connection components 302, 304, 306, 308 provide mating power connections to an associated mains building power system (not shown).

Assembly 300 illustrates example phase components 302, 304, 306, 308 for connections of the adaptable modular line filter connector 100. The ground component 302 and phase components 304, 306, 308 are attached to generally cylindrical connecting members that are overlapped within the modular line filter connector 100 to allow connections between ground and phase components. A phase connecting cylindrical member 310 is provided for connecting to one phase and includes an inwardly stepped portion 312. As shown in FIG. 3, the phase connecting cylindrical member 310 is located below the phase component 308. A ground connection member 314 is shown that is a generally flat, circular band member.

Assembly 400 further illustrates interior details of the adaptable modular line filter connector 100. A phase connecting cylindrical member 402 is attached to the phase component 304. A phase connecting cylindrical member 404 is attached to the phase component 308 and provides connection by overlapping the phase connecting cylindrical member 310. The phase connecting cylindrical member 402 includes a ledge portion 406 at a distal end spaced from the phase component 308.

Figure 5:
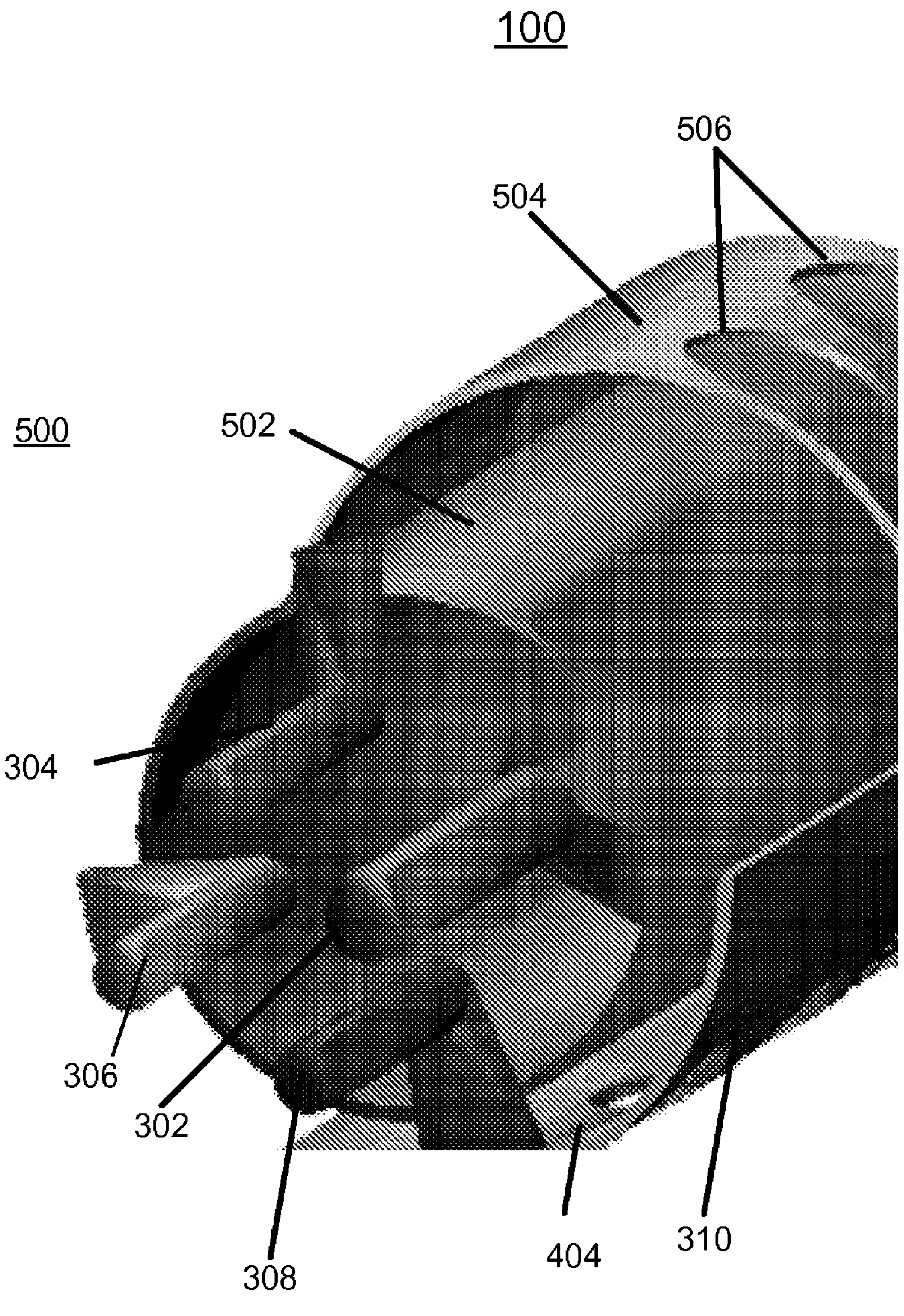
FIGS. 5 and 6 are respective perspective views illustrating assembly of the modular line filter connector of FIG. 1 in accordance with the preferred embodiment.
Figure 6:
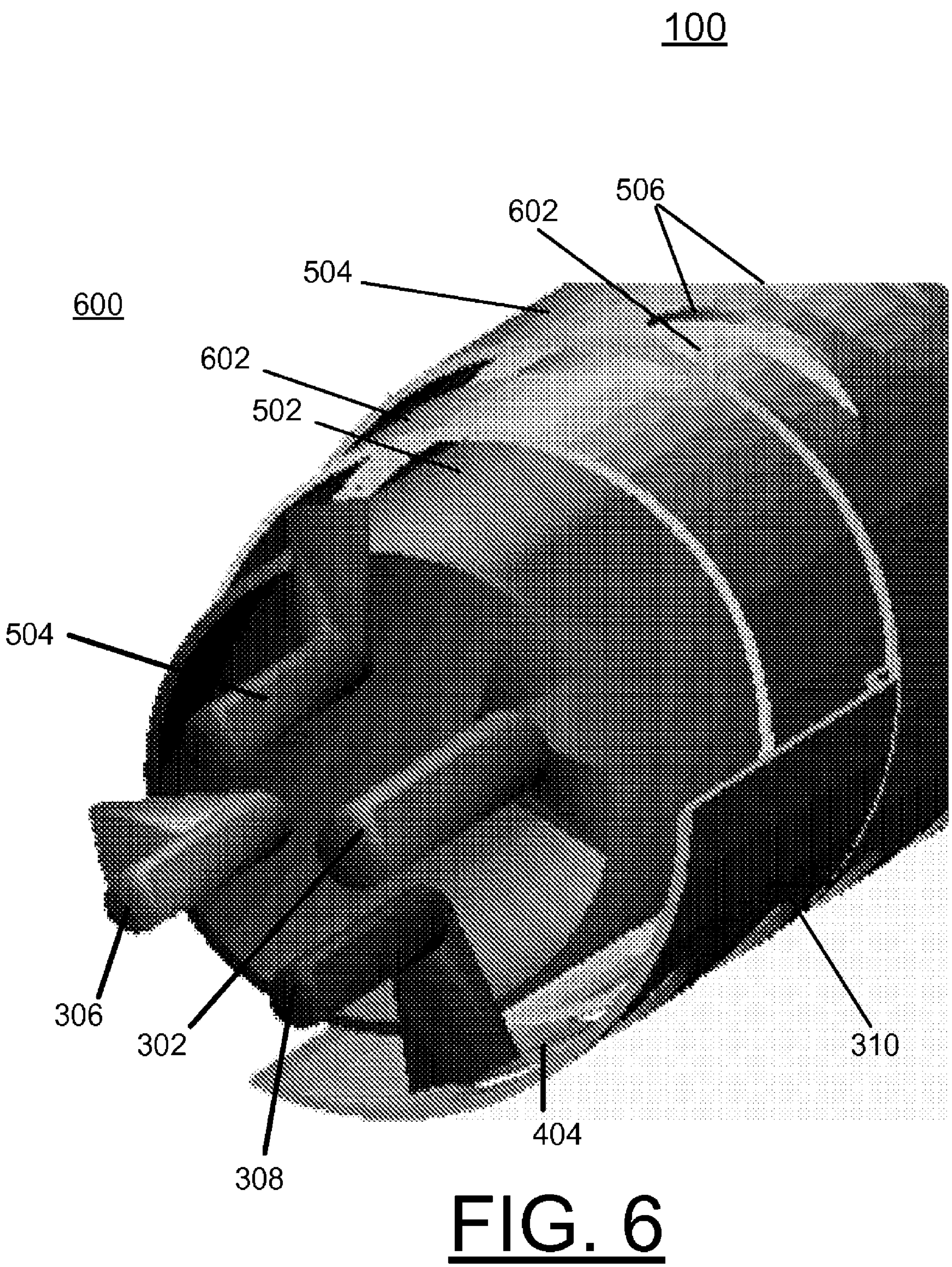

In FIGS. 5 and 6, a next sequence of assembly generally designated by the reference characters 500, 600 is shown of the modular line filter connector 100 of the invention from inside to outside in accordance with the preferred embodiment.

In assembly 500, a ground connection member 502 is shown forming an interior elongated grounding plug that generally traverses the length of the connector 100. A ground connection member 504 encompasses or wraps around the outside of the member 502 for connections to other points. The ground connection member 504 includes a plurality of generally circular openings or cutouts 506.

Assembly 600 further illustrates the adaptable modular line filter connector 100. A phase connecting cylindrical member 602 provides a common connection, which, for example, essentially floats above the ground connection plug member 502 within the ground connection housing 504 to provide an interconnection to the phases and ground. The phase connecting cylindrical member 602 is an elongated member extending along the length of the connector 100.

Figure 7:
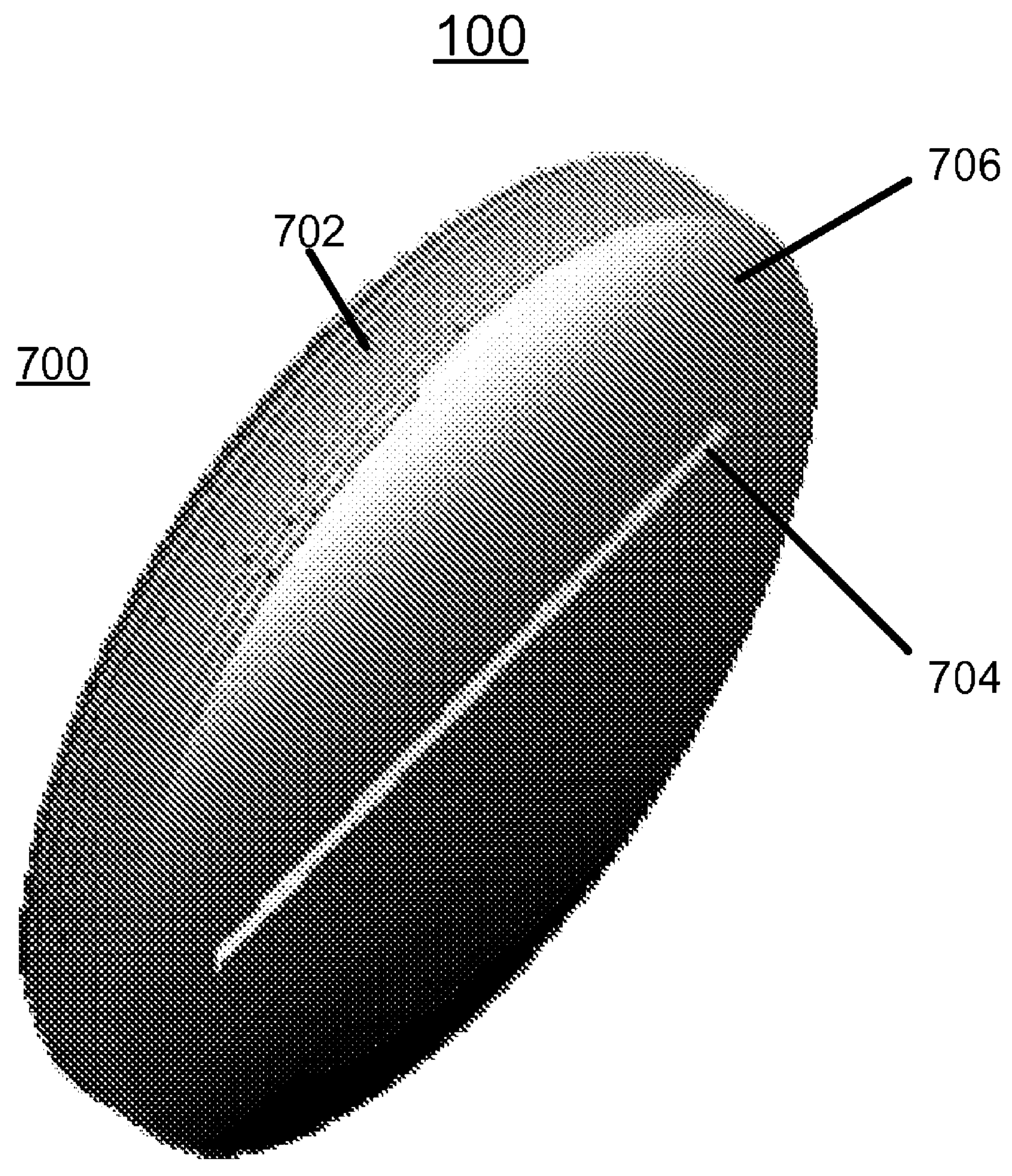
FIGS. 7 and 8 are respective perspective views illustrating an example filtering plug of the modular line filter connector of FIG. 1 in accordance with the preferred embodiment.
Figure 8:
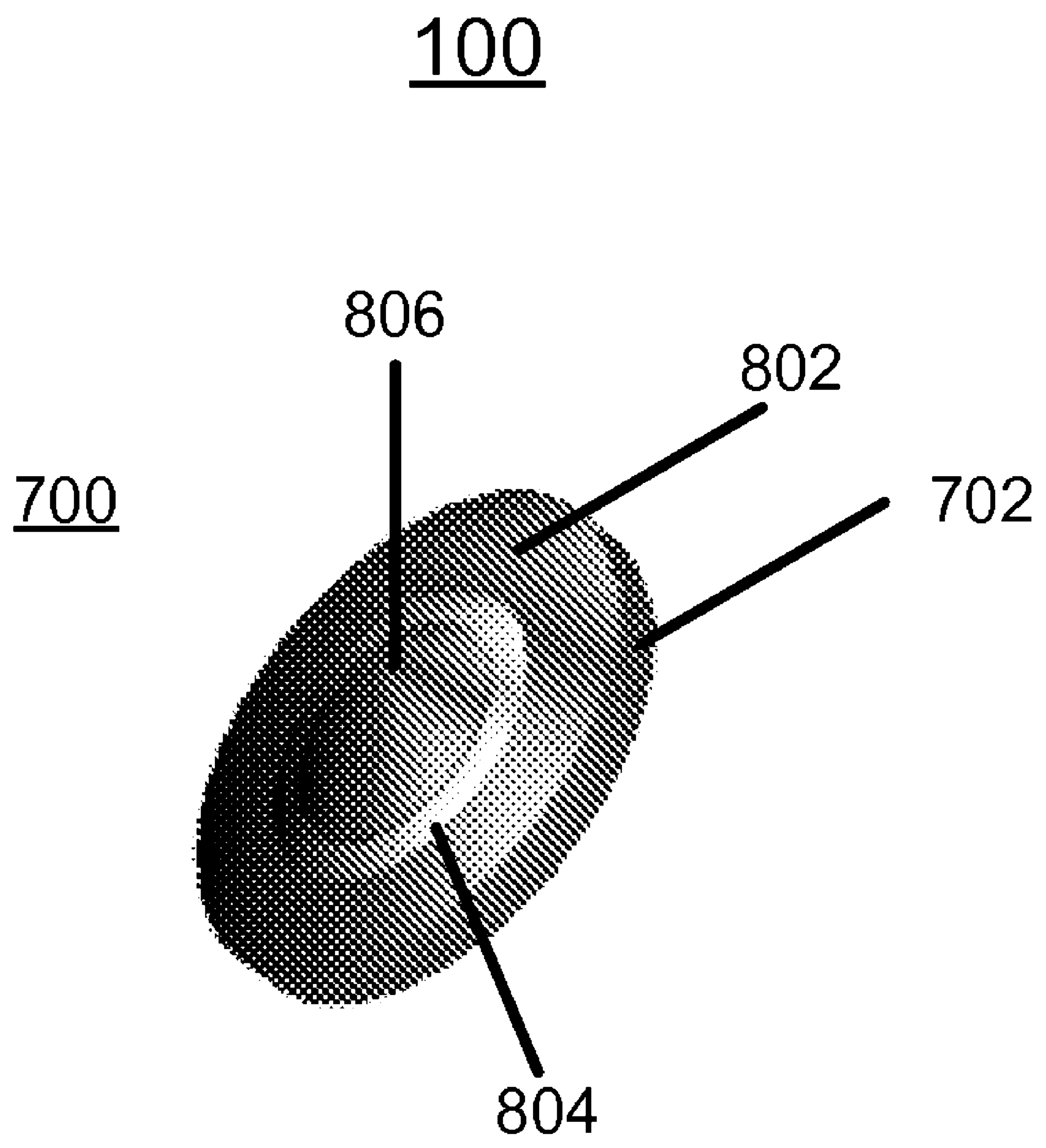

Referring now to FIGS. 7 and 8, there is shown a filtering plug generally designated by the reference character 700 of the modular line filter connector 100 in accordance with the preferred embodiment.

In accordance with features of the invention, a selected one or more of multiple filtering plugs 700 is selectively provided within the connector 100 based upon the particular filtering requirements. Each of multiple filtering plugs 700 includes discrete X1, X2 or Y1, Y2 capacitors (not shown) for example, mounted on a board and contained within the plug. Alternatively, plugs 700 can implement discrete components whose form factor is in the shape of the plug itself.

The filtering plug 700 includes a threaded perimeter 702 that is threadingly received or screws in place in any of multiple specified positions within the adaptable modular line filter connector 100. Each of multiple filtering plugs 700 is removable and can be replaced with a different plug 700 based upon the filtering requirements for a particular application. The filtering plug 700 includes an interior recessed portion or slot 704 on a first side 706 as shown in FIG. 7. An opposite side 802 includes an electrically insulating portion 804 and a central outwardly protruding portion 806.

The plug outside threads 702 make mechanical and one electrical connection while the interior outwardly protruding or inside bump 806 forms the other terminal for the passive component.

Figure 9:
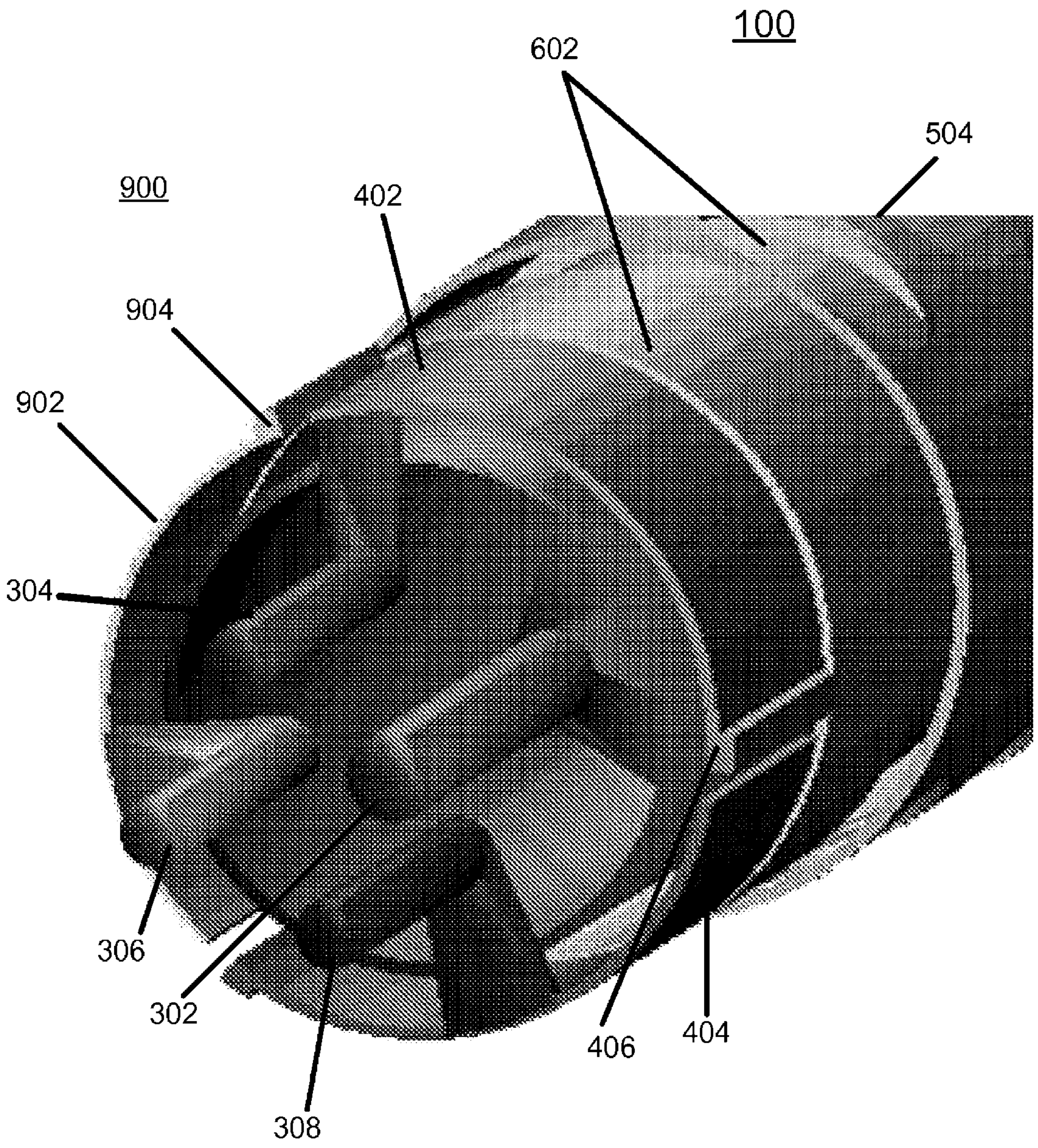
FIGS. 9 and 10 are respective perspective views illustrating further assembly of the modular line filter connector of FIG. 1 in accordance with the preferred embodiment.
Figure 10:
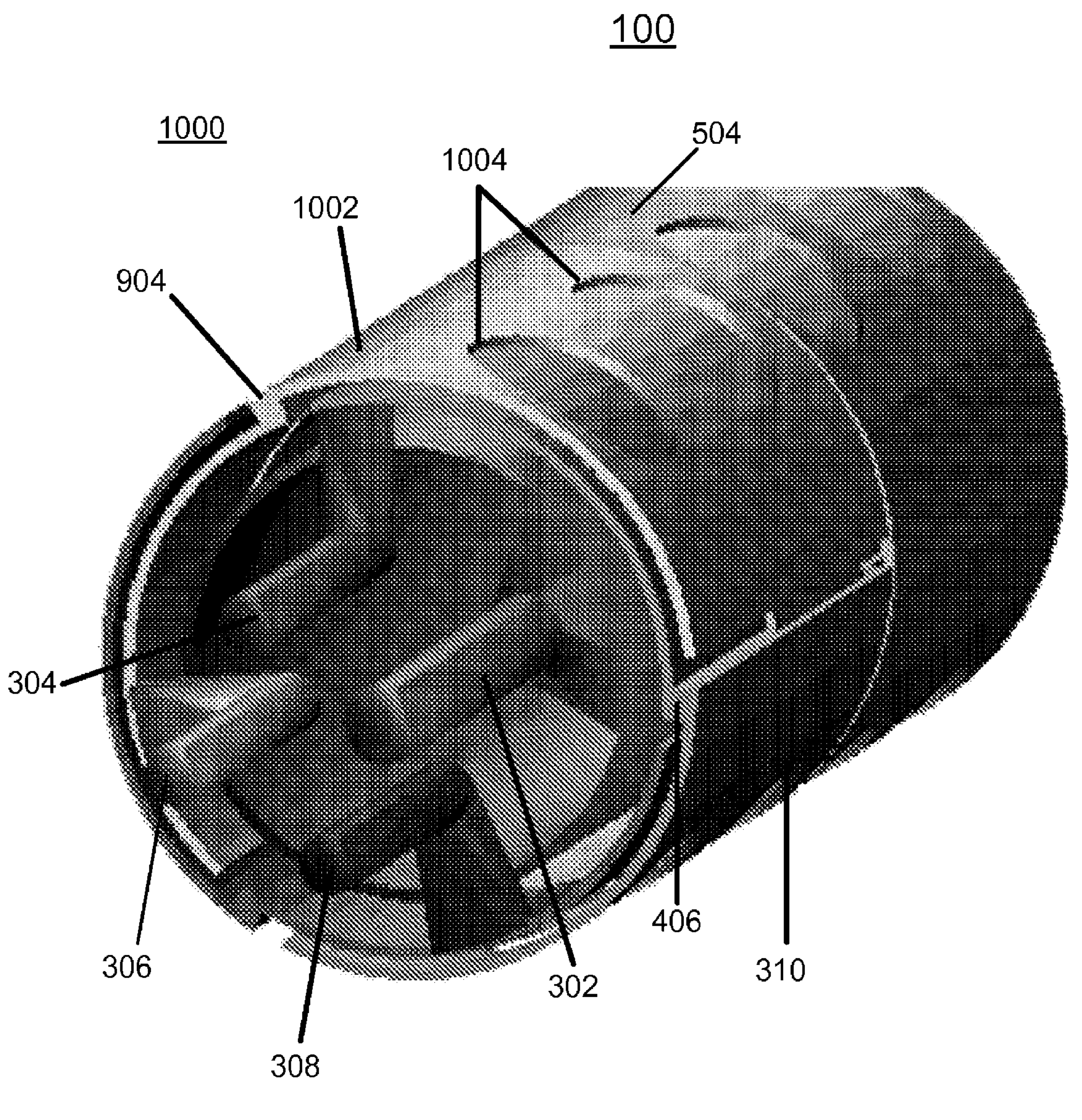

FIGS. 9 and 10 are respective perspective views illustrating further assembly respectively generally designated by the reference character 900 and 1000 of the modular line filter connector 100 in accordance with the preferred embodiment. Assembly 900 illustrates all outside phase connection rings with an additional phase connecting cylindrical member 902 having a ledge portion 904. The phase component 306 is attached to the phase connecting cylindrical member 902.

Assembly 1000 illustrates all outside and inside phase connection rings with a phase connecting cylindrical member 1002 providing a connection of the phase connecting cylindrical member 902. The phase connecting cylindrical member 1002 includes a plurality of generally circular openings or cutouts 1004. Filtering plugs 700 screw into or through the openings 1004 for connections at a selected position within the modular line filter connector 100.

Figure 11:
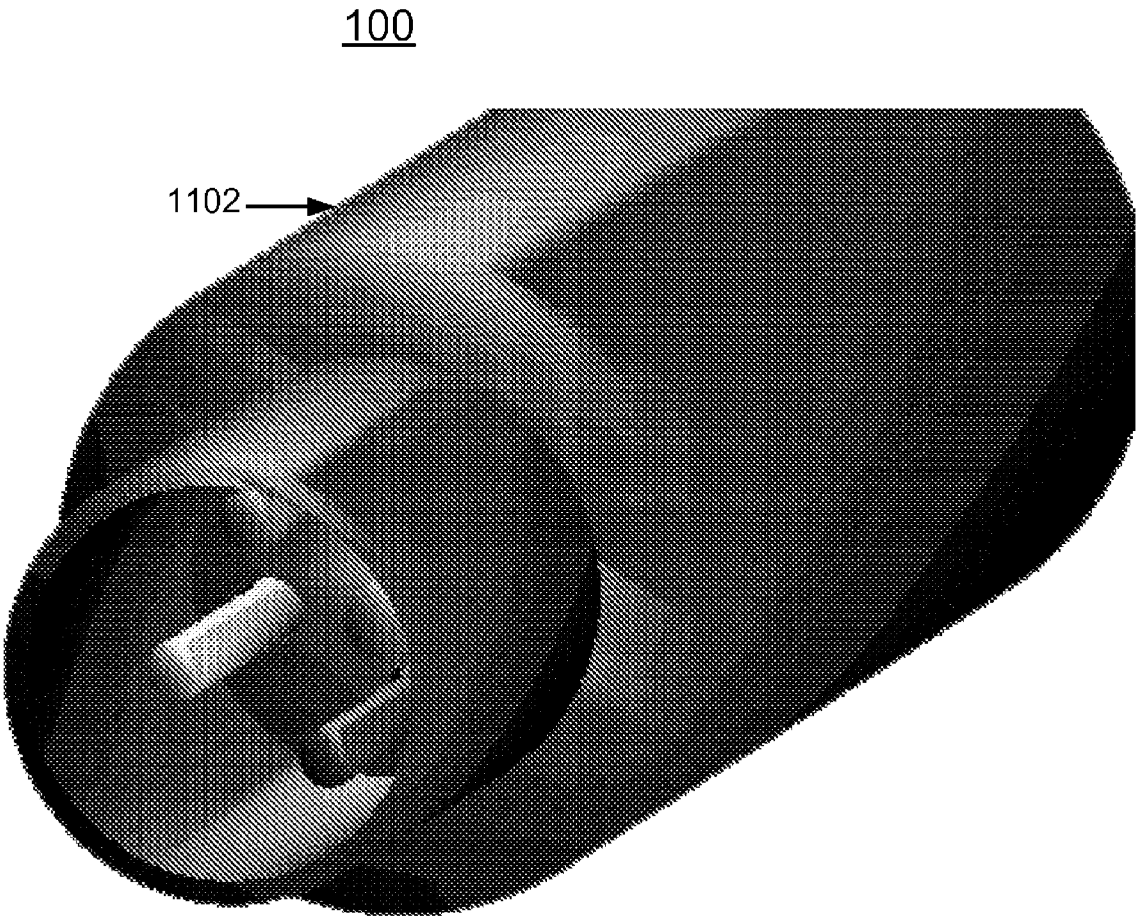
FIG. 11 is a fragmentary perspective view illustrating a completed assembly of the modular line filter connector of FIG. 1 including an example plastic covering placed of the assembly in accordance with the preferred embodiment.

FIG. 11 is a fragmentary perspective view illustrating a final assembly of the modular line filter connector 100 in accordance with the preferred embodiment. The completed modular line filter connector 100 includes an exterior covering or housing generally designated by the reference character 1102 covering the modular line filter connector. The covering 1102 is an electrically insulating housing, for example, formed of a plastic material. The final plastic covering 1102 is placed over the assembly of the modular line filter connector 100 to insulate the interior components from the outside for environmental and safety purposes.

While the present invention has been described with reference to the details of the embodiments of the invention shown in the drawing, these details are not intended to limit the scope of the invention as claimed in the appended claims.

What is claimed is:

1. A modular line filter connector for implementing adaptable three-phase power filtering comprising:

a plurality of selected modular components defining the modular line filter connector; said modular components being selected to adapt the modular line filter connector for different filtering applications;

a pair of outer cylinders providing power filtering connections for the modular line filter connector; said power filtering connections provided with each selected modular component; and said selected modular components being mounted spaced apart along a length of the modular line filter connector.

2. The modular line filter connector as recited in claim 1 wherein said pair of outer cylinders providing power filtering connections include overlapping cylindrical portions providing line-to-line power filtering connections.

3. The modular line filter connector as recited in claim 1 wherein said pair of outer cylinders providing power filtering connections include overlapping cylindrical portions providing line-to-common power filtering connections.

4. The modular line filter connector as recited in claim 1 wherein said pair of outer cylinders providing power filtering connections include overlapping cylindrical portions providing common-to-protective earth power filtering connections.

5. The modular line filter connector as recited in claim 1 wherein said pair of outer cylinders providing power filtering connections include overlapping cylindrical portions providing line-to-protective earth power filtering connections.

6. The modular line filter connector as recited in claim 1 wherein said selected modular components include a filtering plug.

7. The modular line filter connector as recited in claim 6 wherein said filtering plug includes a threaded perimeter portion; said filtering plug threadingly received within the modular line filter connector at a predefined location.

8. The modular line filter connector as recited in claim 7 wherein said threaded perimeter portion of said filtering plug provides a mechanical and an electrical connection.

9. The modular line filter connector as recited in claim 6 wherein said filtering plug includes a generally central outwardly extending portion providing an electrical connection.

10. The modular line filter connector as recited in claim 1 includes an integral power connector to a three-phase power system.

11. The modular line filter connector as recited in claim 10 wherein said integral power connector includes a plurality of outwardly extending prong members.

12. The modular line filter connector as recited in claim 1 includes an electrically insulating housing containing said plurality of selected modular components and said pair of outer cylinders providing power filtering connections.

13. The modular line filter connector as recited in claim 11 wherein said electrically insulating housing is formed of a plastic material.

14. An integral power and modular line filter connector for implementing adaptable three-phase power filtering comprising:

a plurality of outwardly extending prong members, each providing integral power connector connections to a power system;

a plurality of selected modular components defining the modular line filter connector; said modular components being selected to adapt the modular line filter connector for different filtering applications;

a pair of outer cylinders providing power filtering connections for the modular line filter connector; said power filtering connections provided with each selected modular component; and said selected modular components being mounted spaced apart along a length of the modular line filter connector.

15. The integral power and modular line filter connector as recited in claim 14 wherein said selected modular components include a removable filtering plug.

16. The integral power and modular line filter connector as recited in claim 15 wherein said removable filtering plug includes a threaded perimeter portion; said filtering plug threadingly received within the modular line filter connector at a predefined location.

17. The integral power and modular line filter connector as recited in claim 16 wherein said threaded perimeter portion of said filtering plug provides a mechanical and an electrical connection.

18. The integral power and modular line filter connector as recited in claim 15 wherein said removable filtering plug includes a generally central outwardly extending portion providing an electrical power filtering connection.

19. The integral power and modular line filter connector as recited in claim 14 wherein said pair of outer cylinders providing power filtering connections include overlapping cylindrical portions providing line-to-line power filtering connections.

20. The integral power and modular line filter connector as recited in claim 14 includes an electrically insulating housing containing said plurality of selected modular components and said pair of outer cylinders providing power filtering connections.

* * * * *